(12) United States Patent
Saiki et al.

(10) Patent No.: US 9,515,104 B2
(45) Date of Patent: Dec. 6, 2016

(54) SEMICONDUCTOR DEVICE

(71) Applicant: Renesas Electronics Corporation, Kawasaki-shi, Kanagawa (JP)

(72) Inventors: Tsukasa Saiki, Yokohama (JP); Shido Tanaka, Yokohama (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/092,989

(22) Filed: Nov. 28, 2013

(65) Prior Publication Data
US 2014/0151832 A1  Jun. 5, 2014

(30) Foreign Application Priority Data

Dec. 3, 2012  (JP) ................. 2012-264139

(51) Int. Cl.
*H01L 27/146* (2006.01)
(52) U.S. Cl.
CPC ... *H01L 27/14603* (2013.01); *H01L 27/14636* (2013.01)
(58) Field of Classification Search
CPC ............. H01L 31/02005; H01L 27/14636; H01L 27/14603
See application file for complete search history.

(56) References Cited

U.S. PATENT DOCUMENTS

| 5,847,381 | A | * | 12/1998 | Isogai | 250/208.1 |
| 6,946,638 | B2 | * | 9/2005 | Kuwazawa et al. | 250/208.1 |
| 7,030,918 | B1 | * | 4/2006 | Nakashiba | 348/294 |
| 2006/0208289 | A1 | * | 9/2006 | Ohkawa et al. | 257/291 |
| 2007/0145237 | A1 | * | 6/2007 | Ohkawa | H01L 27/14603 250/208.1 |

(Continued)

FOREIGN PATENT DOCUMENTS

| JP | 2007-180336 A | 7/2007 |
| JP | 2010-135844 A | 6/2010 |
| JP | 2011-216865 A | 10/2011 |

OTHER PUBLICATIONS

Office Action, issued Aug. 30, 2016, in Japanese Application No. 2012-264139.

*Primary Examiner* — Olik Chaudhuri
*Assistant Examiner* — Bitew Dinke
(74) *Attorney, Agent, or Firm* — Shapiro, Gabor and Rosenberger, PLLC

(57) ABSTRACT

A semiconductor device includes a semiconductor substrate, a light receiving element region, a peripheral region, a boundary region, a plurality of signal lines, and a conductive layer. In light receiving element region, light receiving elements for performing photoelectric conversion are formed. Peripheral region is formed outside light receiving element region for performing input/output of an electric signal from/to the outside of the semiconductor substrate. Boundary region is formed between light receiving element region and peripheral region. The plurality of signal lines are arranged in boundary region for performing input/output of electric signals between light receiving element region and peripheral region. Conductive layer is arranged in a layer different from each of the plurality of signal lines. A relative position of conductive layer as seen from each of the plurality of signal lines is all identical, and conductive layer is all arranged in an identical layer.

5 Claims, 13 Drawing Sheets

(56) References Cited

U.S. PATENT DOCUMENTS

| | | |
|---|---|---|
| 2008/0001192 A1* | 1/2008 | Inoue et al. ............... 257/291 |
| 2008/0029837 A1* | 2/2008 | Kameda et al. ............ 257/443 |
| 2008/0105908 A1* | 5/2008 | Lee ........................... 257/290 |
| 2008/0142919 A1* | 6/2008 | Shin .......................... 257/435 |
| 2008/0197268 A1* | 8/2008 | Kameda ................. 250/208.1 |
| 2008/0231733 A1* | 9/2008 | Fujioka et al. ............ 348/246 |
| 2008/0302952 A1* | 12/2008 | Yamashita et al. ......... 250/226 |
| 2009/0032853 A1* | 2/2009 | Kim ........................... 257/292 |
| 2009/0189236 A1* | 7/2009 | Hayashi ............ H01L 27/14623 257/432 |
| 2009/0201393 A1* | 8/2009 | Tai et al. .................... 348/243 |
| 2009/0242739 A1 | 10/2009 | Ohkawa |
| 2011/0227182 A1 | 9/2011 | Aoki |
| 2012/0012961 A1* | 1/2012 | Kataoka et al. ............ 257/432 |
| 2013/0037902 A1* | 2/2013 | Nakazawa ........ H01L 27/14627 257/432 |
| 2014/0036119 A1* | 2/2014 | Shimomura et al. ......... 348/294 |

\* cited by examiner

FIG.2
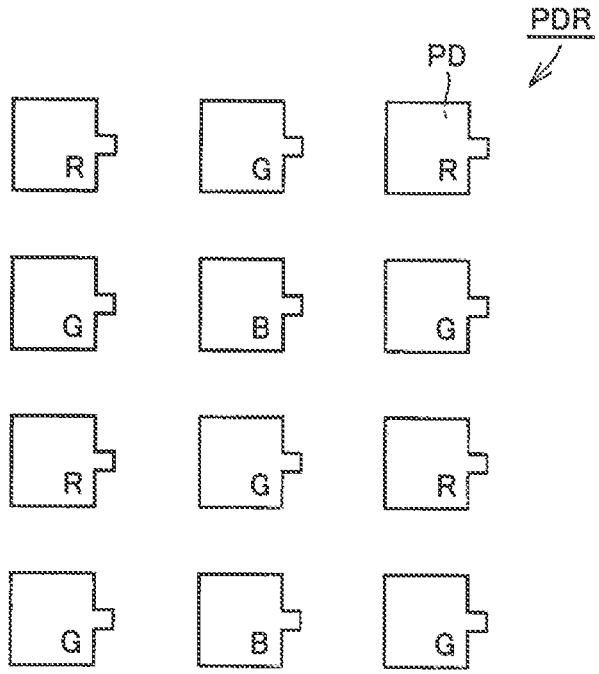
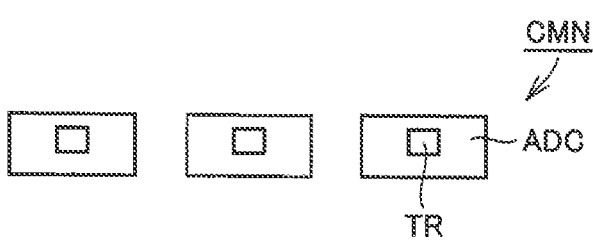

FIG.9
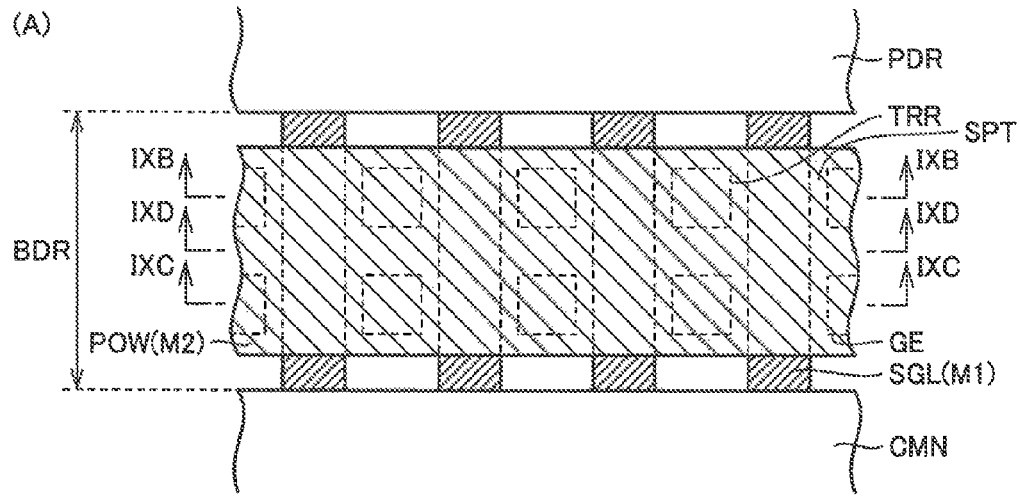
(A)
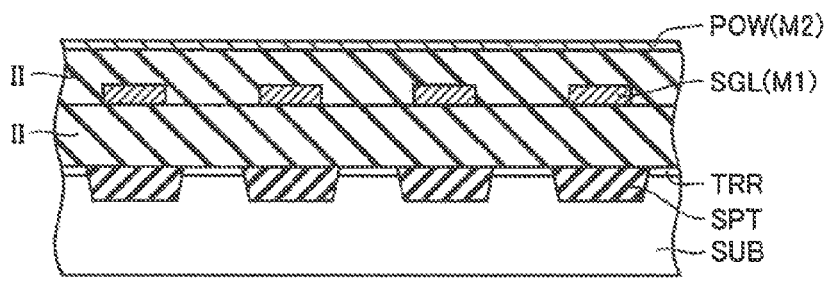
(B)
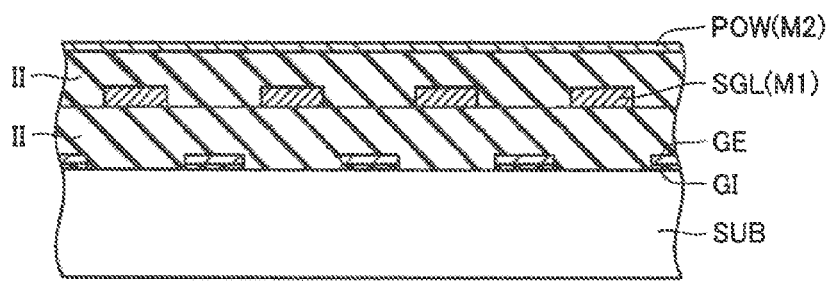
(C)
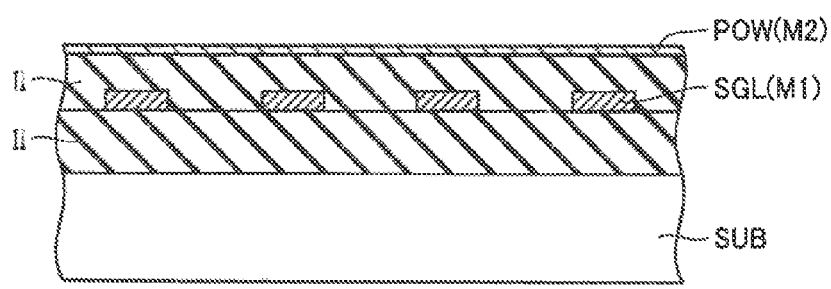
(D)

SEMICONDUCTOR DEVICE

BACKGROUND OF THE INVENTION

Field of the Invention

The present invention relates to a semiconductor device, and in particular to a semiconductor device including signal lines connecting a region in which light receiving elements are formed with a peripheral region.

Description of the Background Art

As CMOS image sensors achieve higher performance, it becomes increasingly important to suppress variation in characteristics among elements constituting the same. For example, Japanese Patent Laying-Open No. 2007-180336 discloses a configuration suppressing variation in signal voltage among a plurality of light receiving elements in a region in which the light receiving elements are arranged.

Further, as CMOS image sensors are miniaturized, wiring layers become thinner, which may cause weakening of the function of shielding a region in which entrance of light is undesirable. This is because a thin film is more likely to transmit light than a thick film. For example, Japanese Patent Laying-Open No. 2010-135844 proposes a configuration achieving both a thinner wiring layer by downsizing light receiving elements of a CMOS (Complementary Metal Oxide Semiconductor) image sensor and ensured shielding property for a region in which entrance of light is undesirable.

When a semiconductor device including a CMOS image sensor is formed, polishing processing called CMP (Chemical Mechanical Polishing) is generally performed to planarize a surface of a formed insulating film or the like. During the CMP, a force is applied downward from above the surface of the formed thin film. In order to receive the force more uniformly, a columnar thin film layer may be formed as a so-called dummy in a region in which thin film layers are arranged in a relatively low planar density, of a region subjected to the CMP. This dummy will be hereinafter referred to as a CMP dummy.

A CMOS image sensor has a light receiving element region in which light receiving elements such as photodiodes are arranged, and a peripheral region for performing input/output of an electric signal between the light receiving element region and an external circuit. Between the light receiving element region and the peripheral region, there exists a region in which elements such as a transistor are not arranged (i.e., a boundary region between the light receiving element region and the peripheral region). In the boundary region, only signal lines performing input/output of electric signals between the light receiving elements and elements in the peripheral region are arranged.

However, it is preferable to arrange a CMP dummy particularly in the boundary region in order to improve processing accuracy of the CMP as described above. Since a CMP dummy is formed by automatically computing a region in which it is preferably arranged, a planar shape and arrangement thereof are random relative to arrangement of regular elements and wires. As a result, impedance mismatching has occurred among the plurality of signal lines arranged in the boundary region due to random arrangement of the arranged CMP dummy. As CMOS image sensors achieve higher performance, it becomes increasingly important to suppress impedance mismatching among elements constituting the same.

Although the patent documents described above consider variation in characteristics among elements and maintaining of shielding property, they do not consider variation in electrical characteristics due to a CMP dummy arranged in a region having a low density of elements, wiring layers, and the like, and they do not include a description about a CMP dummy at all. Therefore, these documents neither disclose nor suggest means for solving the above problem.

SUMMARY OF THE INVENTION

According to one embodiment, a semiconductor device includes a semiconductor substrate, a light receiving element region, a peripheral region, a boundary region, a plurality of signal lines, and a conductive layer. In the light receiving element region, light receiving elements for performing photoelectric conversion are formed. The peripheral region is formed outside the light receiving element region for performing input/output of an electric signal from/to the outside of the semiconductor substrate. The boundary region is formed between the light receiving element region and the peripheral region as seen in plane. The plurality of signal lines are arranged in the boundary region for performing input/output of electric signals between the light receiving element region and the peripheral region. The conductive layer is arranged in a layer different from each of the plurality of signal lines. A relative position of the conductive layer as seen from each of the plurality of signal lines is all identical, and the conductive layer is all arranged in an identical layer.

According to one embodiment, a semiconductor device suppressing variation in characteristics among elements can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2(A) is a schematic plan view showing how photodiodes are arranged in a light receiving element region in FIG. 1, and FIG. 2(B) is a schematic plan view showing how AD conversion circuits are arranged in a column region in FIG. 1.

FIG. 9(A) is an enlarged plan view schematically showing a configuration of a region surrounded by the rounded dotted line in FIG. 1 as seen in plane in a third modified example of Embodiment 1, FIG. 9(B) is a schematic cross sectional view in a portion along a line IXB-IXB in FIG. 9(A), FIG. 9(C) is a schematic cross sectional view in a portion along a line IXC-IXC in FIG. 9(A), and FIG. 9(D) is a schematic cross sectional view in a portion along a line IXD-IXD in FIG. 9(A).

DESCRIPTION OF THE PREFERRED EMBODIMENTS

Hereinafter, one embodiment will be described based on the drawings.

Embodiment 1

Firstly, an overall configuration of a semiconductor device in one embodiment will be described with reference to FIG. 1.

Figure 1:
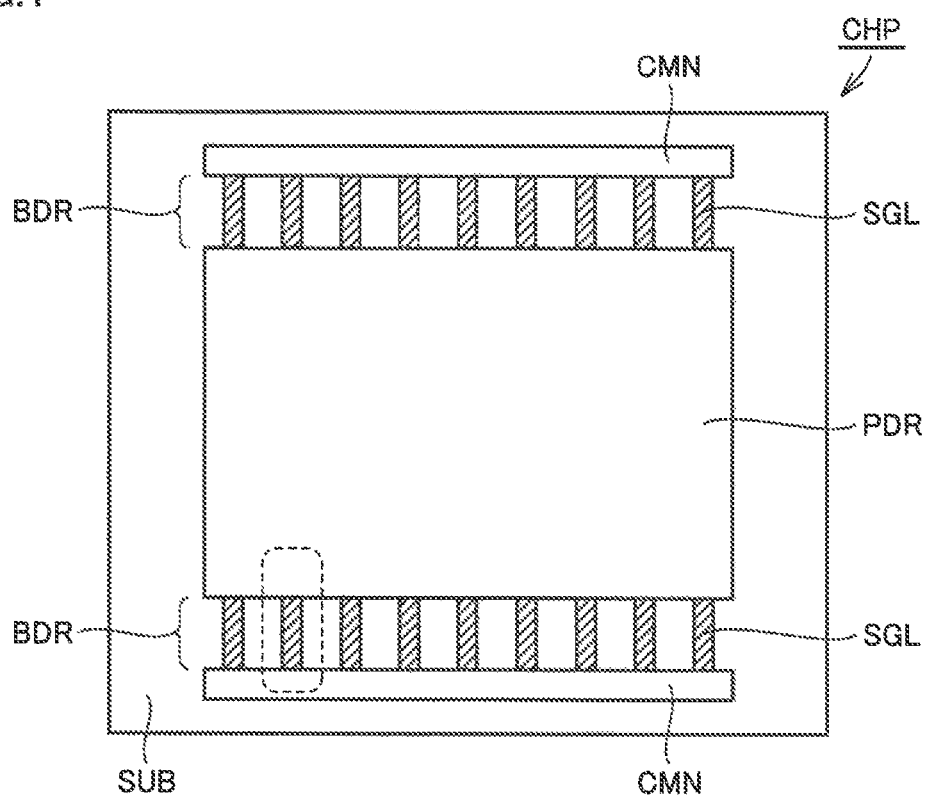
FIG. 1 is a schematic plan view showing an overall configuration of a semiconductor device in one embodiment.

Referring to FIG. 1, the semiconductor device in one embodiment is a solid-state imaging element such as a CMOS image sensor formed as a semiconductor chip CHP.

Semiconductor chip CHP mainly has a semiconductor substrate SUB, a light receiving element region PDR, column regions CMN (peripheral regions), boundary regions BDR, and vertical signal lines SGL (signal lines).

Semiconductor substrate SUB is a member formed of, for example, monocrystalline silicon, having a flat plate-like main surface. Light receiving element region PDR is formed in, for example, a central portion of the main surface of semiconductor substrate SUB. In light receiving element region PDR, a plurality of light receiving elements such as photodiodes are arranged to be arrayed.

More specifically, referring to FIG. 2(A), in light receiving element region PDR, the plurality of photodiodes PD are arranged to be arrayed, for example, in a matrix. Photodiode PD is a light receiving element for converting a signal of received light into a signal charge by photoelectric conversion. Each photodiode PD has any of red (R), green (G), and blue (B) color filters, and light incident on photodiode PD is converted by the color filter into light having a wavelength of any of red, green, and blue colors, and then converted into a signal charge. The signal charge is converted into a voltage by a detection unit not shown. Generally, the number of green color filters is largest.

Column region CMN is formed outside light receiving element region PDR as seen in plane in the main surface of semiconductor substrate SUB. For example, in FIG. 1, column region CMN is formed to face a side forming an edge portion extending in a right-left direction of the drawing, of light receiving element region PDR formed rectangularly in the central portion of the main surface of semiconductor substrate SUB, and to be spaced from light receiving element region PDR.

More specifically, referring to FIG. 2(B), for example, an AD conversion circuit ADC is arranged in column region CMN. AD conversion circuit ADC is a circuit converting a signal of the voltage read from photodiode PD in light receiving element region PDR into a digital signal. By performing computation processing on the digital signal, a signal of an image to be imaged by the CMOS image sensor can be obtained.

The number of AD conversion circuits arranged in column region CMN can be set to any number not less than one. In a case where a plurality of AD conversion circuits ADC are arranged in column region CMN, the plurality of AD conversion circuits ADC are formed to be spaced from each other. In AD conversion circuit ADC, for example, a common MOS (Metal Oxide Semiconductor) transistor TR and the like are arranged.

Transistor TR of AD conversion circuit ADC receives an electric signal from light receiving element region PDR in order to perform input/output of an electric signal between light receiving element region PDR and column region CMN inside semiconductor chip CHP. Further, transistor TR performs input/output of an electric signal between the inside of semiconductor chip CHP and the outside of semiconductor chip CHP.

Boundary region BDR is a region formed between light receiving element region PDR and column region CMN as seen in plane in the main surface of semiconductor substrate SUB. Specifically, boundary region BDR is a region formed between an edge portion extending in the right-left direction of FIG. 1, of the rectangle edge portions of light receiving element region PDR arranged in the central portion of semiconductor substrate SUB as seen in plane, and column region CMN facing the edge portion.

In boundary region BDR, a plurality of (for example, four) vertical signal lines SGL are arranged to be spaced from one another. Vertical signal line SGL is an electric wire for inputting/outputting an electric signal between light receiving element region PDR and column region CMN, and is a thin film layer formed of a commonly known metal material such as, for example, copper or aluminum. Preferably, vertical signal lines SGL extend along a direction from light receiving element region PDR toward column region CMN as seen in plane, and extend in FIG. 1 in an up-down direction of the drawing (i.e., a direction along an edge portion extending in the up-down direction of the rectangle of light receiving element region PDR).

Although vertical signal lines SGL are shown in FIG. 1 to be arranged in boundary region BDR only, vertical signal lines SGL are actually arranged to extend from the inside of light receiving element region PDR, via boundary region BDR, to the inside of column region CMN. More specifically, vertical signal lines SGL are arranged to extend from photodiodes PD existing inside light receiving element region PDR, via boundary region BDR, to transistors TR existing in AD conversion circuits ADC in column region CMN. Thereby, vertical signal lines SGL can input/output electric signals between light receiving element region PDR and column region CMN. Although one vertical signal line SGL may be connected for each photodiode PD, a plurality of photodiodes PD may use one vertical signal line SGL in common.

Next, ranges of light receiving element region PDR and column region CMN as seen in plane will be described with reference to FIGS. 3 and 4.

Figure 3:
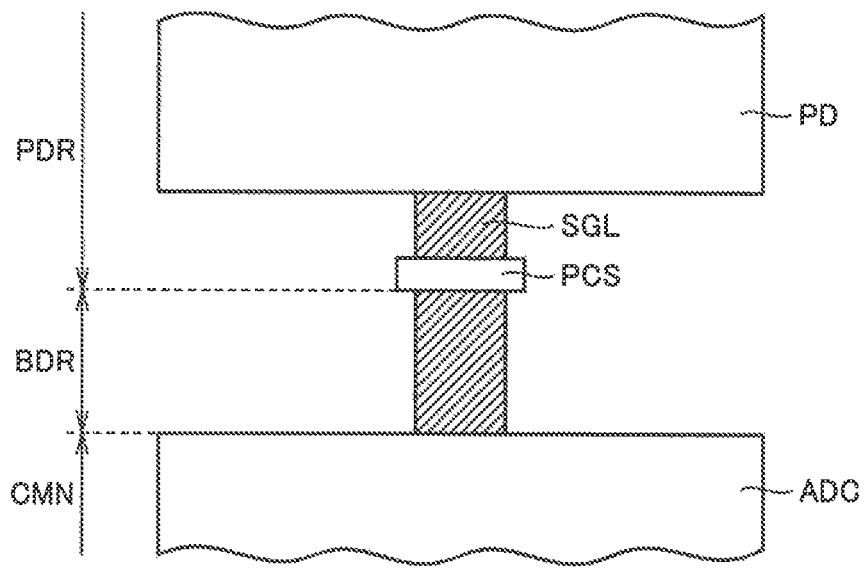
FIG. 3 is a first schematic plan view for illustrating definitions of the light receiving element region, the column region, and a boundary region sandwiched therebetween.

Referring to FIG. 3, light receiving element region PDR may have pixel current sources PCS in addition to photodiodes PD described above. Pixel current source PCS is a component arranged to pass a low current to vertical signal line SGL, and is generally arranged between each of the plurality of photodiodes PD arranged in light receiving element region PDR and column region CMN, in particular in the vicinity of photodiode PD, as shown in FIG. 3. In this case, the range of light receiving element region PDR includes a region in which the plurality of photodiodes PD are arranged and a region in which pixel current sources PCS are arranged. Here, the region in which the plurality of photodiodes PD are arranged includes each region sandwiched between any adjacent pair of photodiodes PD of photodiodes PD arrayed, for example, in a matrix. Further, the region in which pixel current sources PCS are arranged includes a region between photodiode PD and pixel current source PCS in FIG. 3 (relative to an up-down direction of FIG. 3). In a case where pixel current sources PCS are arranged outside photodiodes PD, outer edges of pixel current sources PCS serve as an edge portion of light receiving element region PDR.

Figure 4:
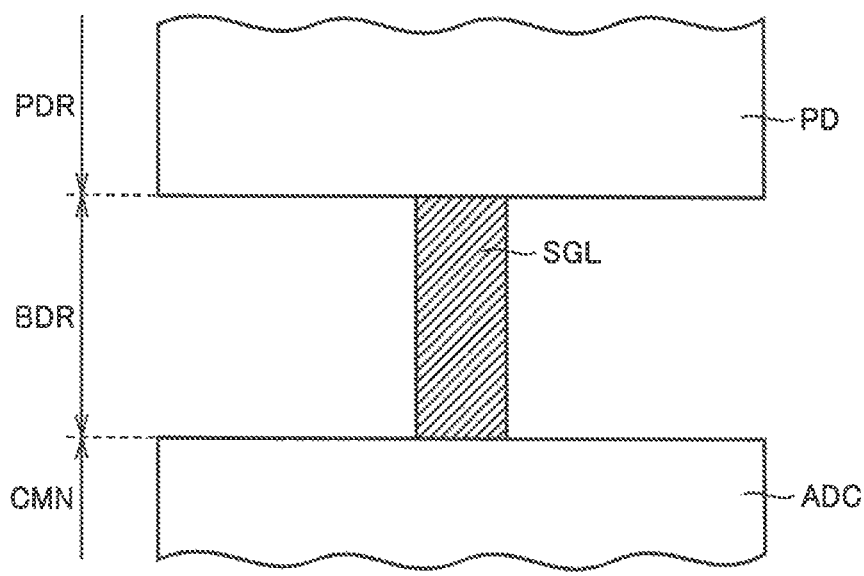
FIG. 4 is a secondary schematic plan view for illustrating definitions of the light receiving element region, the column region, and the boundary region sandwiched therebetween.

Referring to FIG. 4, in a case where no pixel current source PCS exists or pixel current sources PCS exist at positions far from light receiving element region PDR, the range of light receiving element region PDR is equal to the region in which the plurality of photodiodes PD are arranged (including each region sandwiched between any adjacent pair of photodiodes PD). That is, an edge portion of light receiving element region PDR is formed of outer edges of outermost photodiodes PD.

In either case of FIGS. 3 and 4, column region CMN ranges over a region in which AD conversion circuits ADC are arranged and each region sandwiched between the plurality of AD conversion circuits ADC, and an edge portion of column region CMN is formed of outer edges of outermost AD conversion circuits ADC. In addition, in either case of FIGS. 3 and 4, a region sandwiched between light receiving element region PDR and column region CMN serves as a range of boundary region BDR.

Although light receiving element region PDR and column region CMN are each shown in FIG. 1 to have a rectangular shape, the shape merely shows a planar shape of each region approximately, and outer edges of each region may have a shape other than a complete rectangle or square.

Referring to FIGS. 5(A) to 5(D), in boundary region BDR, a lowermost metal layer M1 (on a side close to semiconductor substrate SUB) is arranged as vertical signal lines SGL. That is, the plurality of vertical signal lines SGL are arranged as metal layer M1 in an identical layer in an arbitrary region inside boundary region BDR. A metal layer M2 (conductive layer) is arranged as a layer different from vertical signal lines M1, that is, as a layer above each of vertical signal lines M1 (on a side far from semiconductor substrate SUB).

Referring to FIGS. 5(B) to 5(D), metal layer M2 is formed above metal layer M1 via an interlayer insulating film II such as, for example, a silicon oxide film, using a commonly known metal material such as, for example, copper or aluminum.

Metal layer M2 is arranged in boundary region BDR to extend along the main surface of semiconductor substrate SUB and extend in a direction intersecting with the direction in which vertical signal lines SGL extend (i.e., in a right-left direction of FIG. 5(A)). Metal layer M2 may be used as a power source wire POW for supplying a potential to the elements such as photodiodes PD and transistors TR in semiconductor chip CHP, or as a so-called CMP dummy which is a layer identical to power source wire POW.

Figure 5:
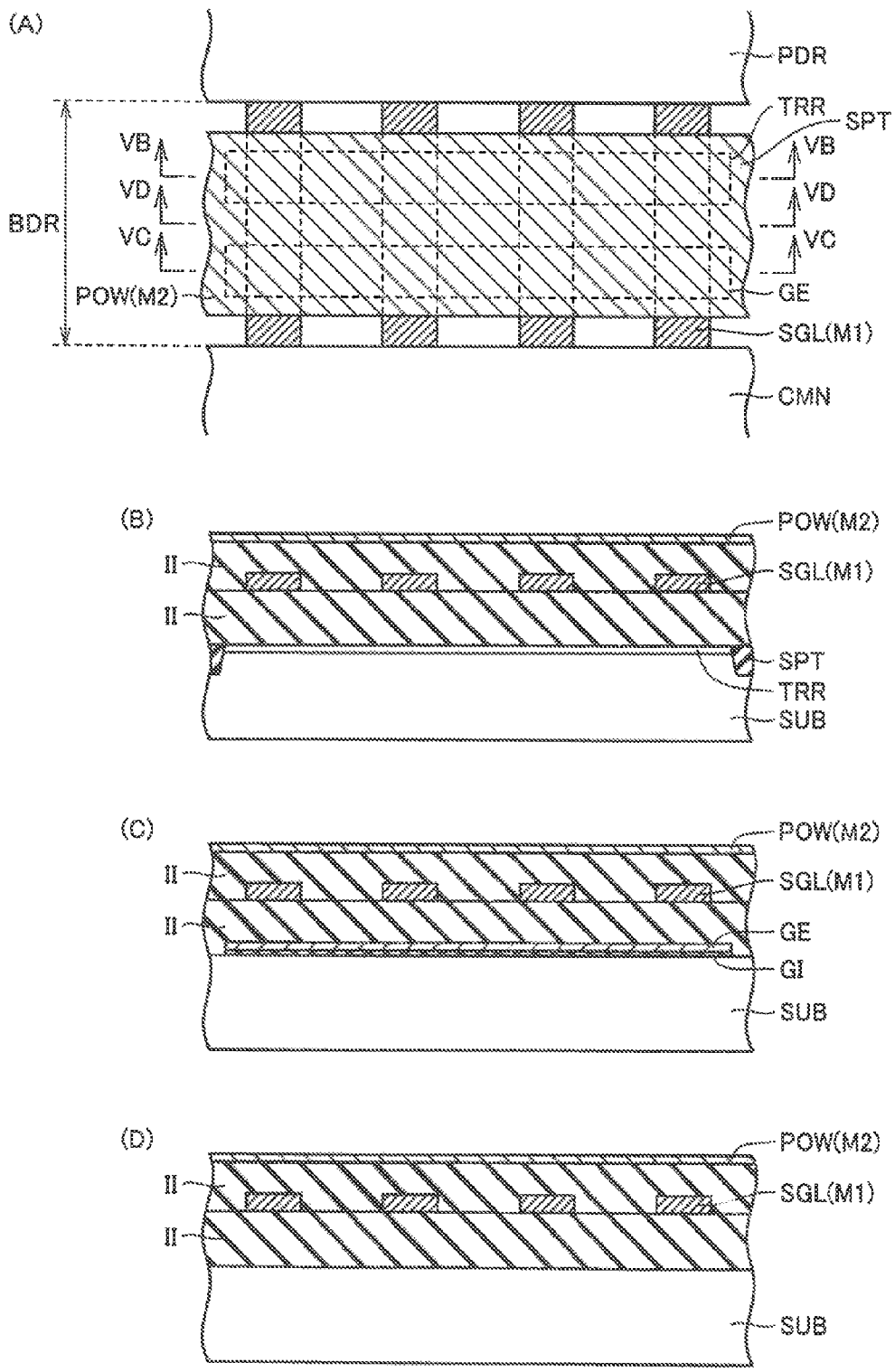
FIG. 5(A) is an enlarged plan view schematically showing a configuration of a region including a region surrounded by a rounded dotted line in FIG. 1 as seen in plane in a typical example of Embodiment 1.
FIG. 5(B) is a schematic cross sectional view in a portion along a line VB-VB in FIG. 5(A)
FIG. 5(C) is a schematic cross sectional view in a portion along a line VC-VC in FIG. 5(A)
FIG. 5(D) is a schematic cross sectional view in a portion along a line VD-VD in FIG. 5(A).

In FIG. 5, the relative position of metal layer M2 as seen from each vertical signal line SGL is all identical. This will be described in detail below.

Referring to FIG. 5(A), metal layer M2 is arranged in boundary region BDR to planarly overlap with all of the plurality of vertical signal lines M1. Here, single metal layer M2 is arranged to planarly overlap with each of the plurality of vertical signal lines M1. That is, at least in boundary region BDR, metal layer M2 is composed of a one-piece layer overlapping with all of vertical signal lines SGL.

However, metal layer M2 does not planarly overlap with each of the plurality of vertical signal lines M1 in end portions of boundary region BDR (i.e., regions in the vicinity of light receiving element region PDR and column region CMN). That is, in boundary region BDR, metal layer M2 may overlap with the whole of each vertical signal line SGL, and may not overlap with the whole of each vertical signal line SGL and may overlap with a portion of each vertical signal line SGL as shown for example in FIG. 5(A).

In a case where metal layer M2 overlaps with only a portion of each vertical signal line SGL, metal layer M2 is arranged to overlap with a region of each vertical signal line SGL identical to one another as seen in plane. The direction in which metal layer M2 extends as seen in plane is a direction substantially perpendicular to the direction in which vertical signal lines SGL extend. Thus, for any vertical signal line SGL, coordinates of the region in which metal layer M2 overlaps with vertical signal line SGL inside boundary region BDR obtained when an outer edge portion of boundary region BDR is used as a reference point are substantially equal. Thereby, the relative position of the region in which metal layer M2 overlaps as seen from each vertical signal line SGL is all identical, and the area of the region in which each vertical signal line SGL overlaps with metal layer M2 is all identical.

Further, with reference to FIGS. 5(A) and 5(B), in boundary region BDR, a transistor formation region TRR is arranged as a layer below vertical signal lines SGL. Here, the layer below vertical signal lines SGL may specifically be, for example, a layer in contact with the main surface of semiconductor substrate SUB (i.e., a layer immediately above semiconductor substrate SUB), and in this case, transistor formation region TRR is formed below metal layer M1 with interlayer insulating film II interposed therebetween.

It is noted that, although transistor formation region TRR is particularly shown as a thin film layer in FIG. 5(B) to facilitate imaging of transistor formation region TRR, a thin film layer may not actually be formed in the region. In a region other than transistor formation region TRR (i.e., on the periphery of transistor formation region TRR), a separation region SPT is formed as a layer identical to transistor formation region TRR. Preferably, separation region SPT is formed by filling the inside of a groove formed in a depth direction from the main surface of semiconductor substrate SUB with an insulating film such as, for example, a silicon oxide film. Separation region SPT can have any configuration capable of defining regions arranged on both sides thereof and electrically separating these regions.

Further, with reference to FIGS. 5(A) and 5(C), in boundary region BDR, a gate electrode layer GE (another conductive layer) is arranged as a layer below vertical signal lines SGL. Here, the layer below vertical signal lines SGL may specifically be, for example, a layer in contact with the main surface of semiconductor substrate SUB (i.e., a layer immediately above semiconductor substrate SUB), and in this case, gate electrode layer GE is formed below metal layer M1 with interlayer insulating film II interposed therebetween. That is, transistor formation region TRR and gate electrode layer GE may be formed as an identical layer.

Gate electrode layer GE is composed of, for example, a thin film of polycrystalline silicon. Gate electrode layer GE may be used, for example, as a gate electrode of a transistor formed in boundary region BDR, or as a so-called CMP dummy which is a layer identical to a gate electrode of transistor TR (see FIG. 2(B)) formed in a region other than boundary region BDR (for example, column region CMN). Immediately below gate electrode layer GE, a gate insulating film GI or a CMP dummy as a layer identical to gate insulating film GI may be arranged.

In boundary region BDR, both transistor formation region TRR and gate electrode layer GE are arranged to extend along the main surface of semiconductor substrate SUB and extend in the direction intersecting with the direction in which vertical signal lines SGL extend (i.e., in the right-left direction of FIG. 5(A)). It is noted that, although transistor formation region TRR and gate electrode layer GE are cut in FIG. 5 at end portions thereof relative to the right-left direction of the drawing in which they extend, they may be configured not to be cut in such a manner and to entirely extend in the whole region shown.

In FIG. 5, the relative position of each of transistor formation region TRR and gate electrode layer GE as seen from each vertical signal line SGL is all identical. That is, transistor formation region TRR and gate electrode layer GE are each arranged to planarly overlap with all of the plurality of vertical signal lines SGL, and to overlap with a region of each vertical signal line SGL identical to one another as seen in plane. Also in transistor formation region TRR and gate electrode layer GE, the direction in which TRR & GE extend as seen in plane is a direction substantially perpendicular to the direction in which vertical signal lines SGL extend, as in metal layer M2. Thus, from the viewpoint similar to that of metal layer M2 described above, the relative position of a region in which each of transistor formation region TRR and gate electrode layer GE overlaps as seen from each vertical signal line SGL is all identical, and the area of the region in which each vertical signal line SGL overlaps with TRR & GE are all identical.

It is noted that, although a layer above metal layer M2 is not shown in each drawing in FIG. 5, for example, interlayer insulating film II covering metal layer M2 and a power source wire as a metal layer M3 are arranged above metal layer M2 as described later. Further, although separation region SPT is also formed in FIGS. 5(C) and 5(D) in a region in which gate electrode layer GE and the like are not formed, as a layer identical to such an element, separation region SPT is not shown in FIGS. 5(C) and 5(D) to provide easy-to-see drawings.

Next, the function and effect of one embodiment will be described with reference to a comparative example in FIG. 6.

Referring to FIGS. 6(A) to 6(D), also in the comparative example, vertical signal lines SGL are arranged as metal layer M1, metal layer M2 is arranged as a layer above metal layer M1, and gate electrode layer GE and transistor formation region TRR are arranged as layers below metal layer M1, as in one embodiment. Further, separation region SPT is also formed. However, in boundary region BDR, these layers M2, TRR, GE, SPT are used as CMP dummies. That is, desired regions requiring the function as CMP dummies are detected by automatic control, and then these layers M2, TRR, GE, SPT are arranged at the desired regions.

Thus, these CMP dummies are each arranged at random as seen in plane. Accordingly, a region in which each vertical signal line SGL overlaps with each of these layers (CMP dummies) is also random among vertical signal lines SGL, and each of the relative position and the area of the region in which each vertical signal line SGL overlaps with each CMP dummy is totally different.

Other than that described above, the configuration in FIG. 6 is basically similar to that in one embodiment, and thus components in FIG. 6 identical to those in one embodiment will be designated by the same reference numerals, and the description thereof will not be repeated.

Figure 6:
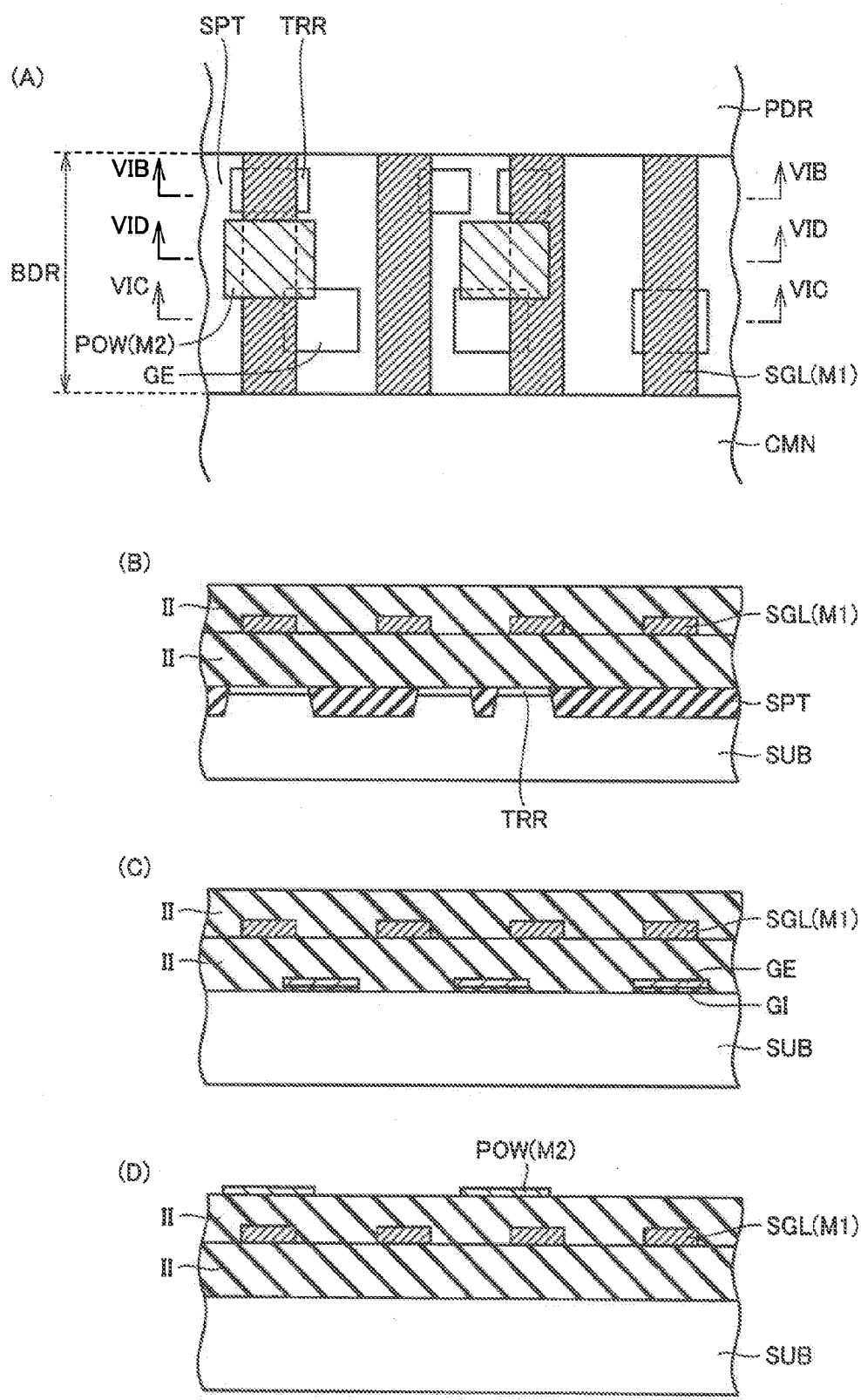
FIG. 6(A) is an enlarged plan view schematically showing a configuration of a region surrounded by the rounded dotted line in FIG. 1 as seen in plane in a comparative example of Embodiment 1.
FIG. 6(B) is a schematic cross sectional view in a portion along a line VIB-VIB in FIG. 6(A)
FIG. 6(C) is a schematic cross sectional view in a portion along a line VIC-VIC in FIG. 6(A)
FIG. 6(D) is a schematic cross sectional view in a portion along a line VID-VID in FIG. 6(A).

In the comparative example in FIG. 6, the magnitude of a parasitic capacitance formed for example by vertical signal line SGL, metal layer M2 thereabove, and interlayer insulating film II therebetween is totally different among vertical signal lines SGL. This is because the area of a portion in which each vertical signal line SGL, interlayer insulating film II, and metal layer M2 overlap with one another is totally different among vertical signal lines SGL. The same applies to the magnitude of a parasitic capacitance formed by vertical signal line SGL, gate electrode layer GE therebelow, and interlayer insulating film II therebetween. In the configuration in FIG. 6, there has been obtained a finding that, since the magnitude of the parasitic capacitance formed due to each vertical signal line SGL varies as described above, electrical characteristics (in particular, impedance) of vertical signal lines SGL vary (i.e., impedance mismatching occurs).

The above description is a discussion about a thickness direction (for example, an up-down direction of FIG. 6(B)) intersecting with the main surface of semiconductor substrate SUB. The same as described above applies to a direction extending along the main surface of semiconductor substrate SUB, and a direction oblique to the main surface of semiconductor substrate SUB. In the configuration in FIG. 6, a parasitic capacitance formed by an adjacent pair of vertical signal lines SGL (for example, relative to the direction extending along the main surface) and an insulating region sandwiched therebetween also varies.

In contrast, in one embodiment, layers M2, TRR, GE, SPT described above are not formed by detecting positions requiring CMP dummies by automatic control. In one embodiment, layers M2, TRR, GE, SPT described above are manually formed such that the relative position of each conductive layer (also usable as a CMP dummy) with respect to each vertical signal line SGL is all identical, and in particular each conductive layer overlaps with each vertical signal line SGL as seen in plane. Therefore, the area of the region in which each vertical signal line SGL overlaps with conductive layer M2 or the like is all identical.

Further, basically in one embodiment, each of metal layer M2 and gate electrode layer GE overlapping with each vertical signal line SGL is a one-piece layer, and each of metal layer M2 and gate electrode layer GE overlapping with any vertical signal line SGL is arranged as an identical layer. Thus, the distance between each vertical signal line SGL and metal layer M2 or the like overlapping with each vertical signal line SGL has a substantially equal value corresponding to the thickness of interlayer insulating film II. Accordingly, the parasitic capacitance produced by each vertical signal line SGL and each conductive layer has a substantially identical value among vertical signal lines SGL. Thus, electrical characteristics (in particular, impedance) of vertical signal lines SGL can be uniformized, and the reliability of semiconductor chip CHP can be improved.

Further, even if metal layer M2 is used as a power source wire and gate electrode layer GE is used as a gate electrode for example, these layers can also be used as CMP dummies. Originally, boundary region BDR is a region free of elements such as a transistor, provided between light receiving element region PDR and column region CMN as a power source reinforcing region for reducing resistance values of a power source wire, a ground wire, and the like arranged in light receiving element region PDR. Accordingly, originally in boundary region BDR, no elements are arranged, and a thin film layer other than vertical signal lines SGL is hardly arranged. In a case where a thin film layer other than vertical signal lines SGL is not arranged, a force supporting from below a force applied from above during CMP in boundary region BDR is weakened, and thus there is a possibility that a defect such as formation of a recess in a surface may occur. In that regard, if metal layer M2 and gate electrode layer GE described above are arranged, these layers have a role as CMP dummies, and thereby can suppress occurrence of a defect such as a recess as described above.

It is noted that, in one embodiment, metal layer M2 is formed as a single layer extending in the direction intersecting with the direction in which vertical signal lines SGL extend, and thereby has a considerably large width slightly shorter than the length of vertical signal lines SGL relative to the direction in which vertical signal lines SGL extend. Since metal layer M2 has a wide cross sectional area, when it is used as power source wire POW, power source wire POW can have a reduced electrical resistance, and drive capability of entire semiconductor chip CHP can be improved by increasing the value of a current flowing to power source wire POW.

Next, modified examples different from the above typical example of one embodiment will be described with reference to FIGS. 7 to 9.

Referring to FIGS. 7(A) to 7(D), a first modified example of one embodiment has a configuration basically similar to that of the typical example of one embodiment shown in FIGS. 5(A) to 5(D). However, in boundary region BDR, each layer (conductive layer) M2, TRR, GE is not composed of a one-piece layer overlapping with all of the plurality of vertical signal lines SGL. Each layer M2, TRR, GE is composed as separate, independent layers arranged at positions overlapping with respective vertical signal lines SGL as seen in plane.

In FIG. 7(A), edge portions of each layer M2, TRR, GE in boundary region BDR extend to extend along the direction in which vertical signal lines SGL extend. However, for example, the edge portions of each layer M2, TRR, GE may extend in a direction oblique to the direction in which vertical signal lines SGL extend. Further, although each layer M2, TRR, GE slightly protrudes from vertical signal line SGL overlapping therewith in FIG. 7(A), each layer M2, TRR, GE may not protrude in such a manner. For example, each layer M2, TRR, GE may completely fit inside vertical signal line SGL, or may be configured to have edge portions overlapping with edge portions of vertical signal line SGL. A planar shape of vertical signal line SGL may completely overlap with a planar shape of each layer M2, TRR, GE.

Other than that described above, the configuration in FIG. 7 is basically similar to that in above typical example (FIG. 5), and thus components in FIG. 7 identical to those in FIG. 5 will be designated by the same reference numerals, and the description thereof will not be repeated. The same applies to the modified examples described below.

Figure 7:
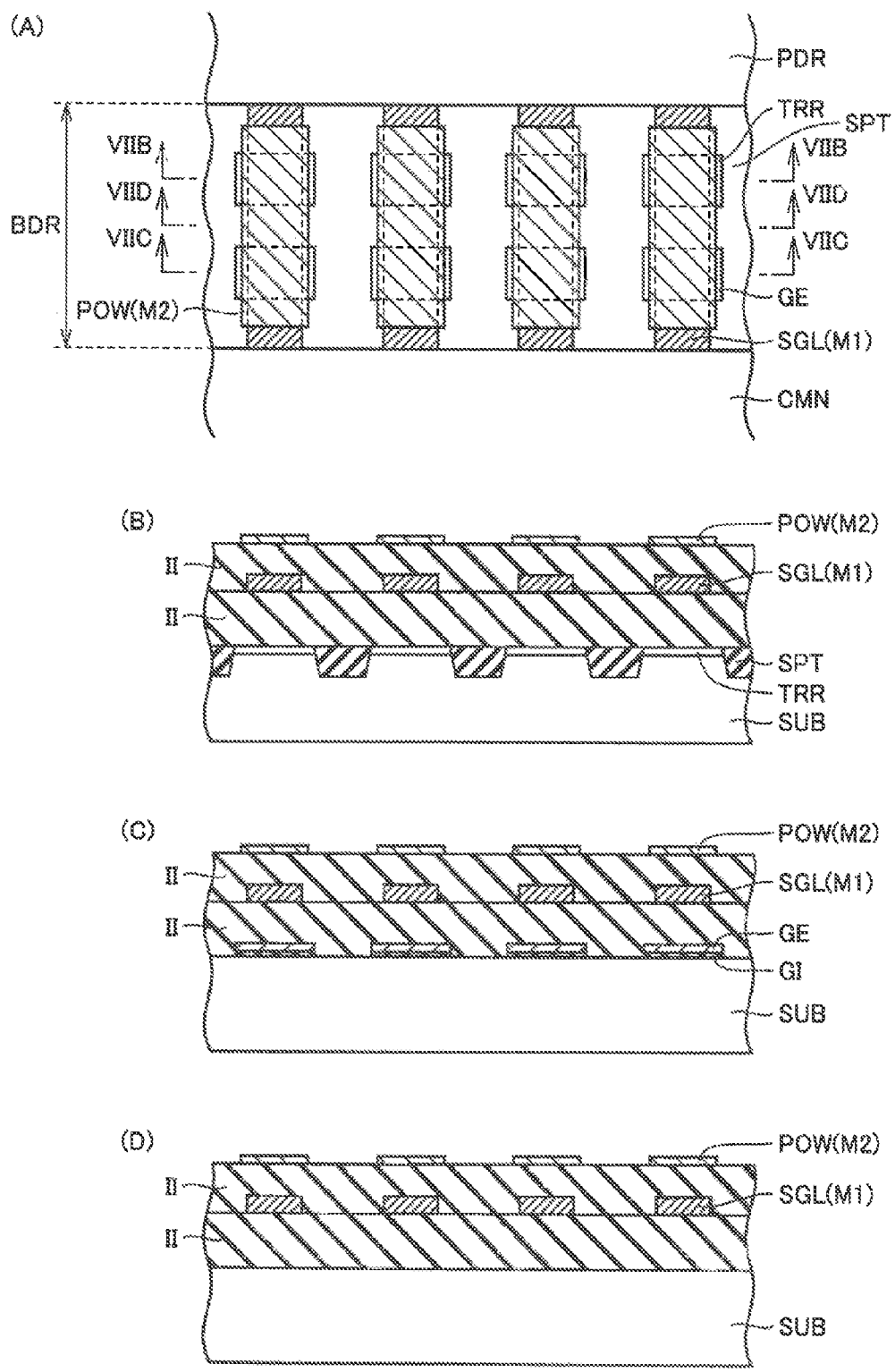
FIG. 7(A) is an enlarged plan view schematically showing a configuration of a region surrounded by the rounded dotted line in FIG. 1 as seen in plane in a first modified example of Embodiment 1.
FIG. 7(B) is a schematic cross sectional view in a portion along a line VIIB-VIIB in FIG. 7(A)
FIG. 7(C) is a schematic cross sectional view in a portion along a line VIIC-VIIC in FIG. 7(A)
FIG. 7(D) is a schematic cross sectional view in a portion along a line VIID-VIID in FIG. 7(A).
Figure 8:
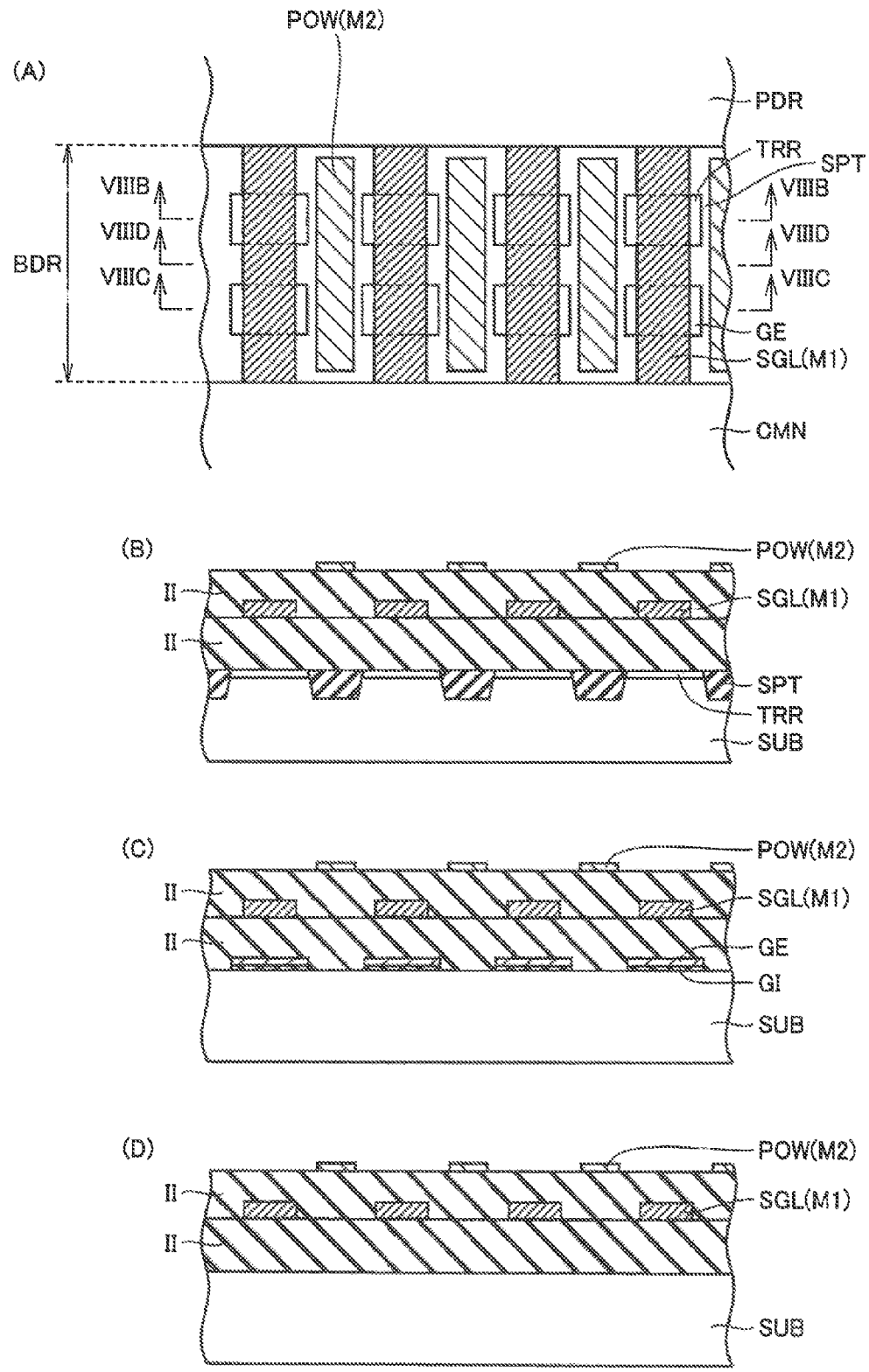
FIG. 8(A) is an enlarged plan view schematically showing a configuration of a region surrounded by the rounded dotted line in FIG. 1 as seen in plane in a second modified example of Embodiment 1.
FIG. 8(B) is a schematic cross sectional view in a portion along a line VIIIB-VIIIB in FIG. 8(A)
FIG. 8(C) is a schematic cross sectional view in a portion along a line VIIIC-VIIIC in FIG. 8(A)
FIG. 8(D) is a schematic cross sectional view in a portion along a line VIIID-VIIID in FIG. 8(A).

Also in the modified example in FIG. 7, the relative position of each layer M2, TRR, GE as seen from each of the plurality of vertical signal lines SGL is all identical. That is, each layer M2, TRR, GE is all arranged to overlap with a region of each vertical signal line SGL identical to one another as seen in plane. Therefore, the area of the region in which each vertical signal line SGL overlaps with conductive layer M2 or the like is all identical.

Further, as shown particularly in FIGS. 7(B) to 7(D), each layer M2, TRR, GE, which is composed as a plurality of independent layers, is all arranged in an identical layer. Specifically, metal layer M2 is all arranged to be in contact with an upper surface of interlayer insulating film II covering metal layer M1, and each layer TRR, GE is all arranged to be in contact with the main surface of semiconductor substrate SUB. Therefore, the distance between each vertical signal line SGL and metal layer M2 or the like overlapping therewith has a substantially equal value corresponding to the thickness of interlayer insulating film II.

Thus, also in the modified example in FIG. 7, the value of a parasitic capacitance formed by each vertical signal line SGL and each layer M2, TRR, GE can be uniformized, as in the typical example in FIG. 5.

It is noted that, also in the present modified example, layers M2, TRR, GE may be used as a power source wire, a constituent region of a transistor, and a gate electrode of the transistor, respectively, or may each be used as a CMP dummy as a layer identical to a power source wire, a gate electrode, or the like. The same applies to the modified examples described below.

Referring to FIGS. 8(A) to 8(D), a second modified example of one embodiment also has a configuration basically similar to that of the typical example of one embodiment shown in FIGS. 5(A) to 5(D). Further, in boundary region BDR, each layer TRR, GE has the same configuration as that of the first modified example in FIGS. 7(A) to 7(D). However, a plurality of metal layers M2 in boundary region BDR are arranged such that they do not overlap with vertical signal lines SGL and are arrayed to be spaced from vertical signal lines SGL relative to the direction extending along the main surface of semiconductor substrate SUB.

Also in this case, as seen from each vertical signal line SGL, the relative position of each metal layer M2 adjacent thereto as seen in plane is all identical. That is, for any vertical signal line SGL, coordinates of a region in which each metal layer M2 adjacent to each vertical signal line SGL exists obtained when an arbitrary identical point in each vertical signal line SGL as seen in plane is used as a reference point are substantially equal.

Therefore, the distance between each vertical signal line SGL and metal layer M2 adjacent thereto as seen in plane (i.e., the thickness of interlayer insulating film II) is all identical. Thus, also in the present example, the value of a parasitic capacitance formed by each vertical signal line SGL and each layer M2, TRR, GE can be uniformized as in the examples described above, and as a result, impedances of vertical signal lines SGL can be matched.

Referring to FIGS. 9(A) to 9(D), a third modified example of one embodiment also has a configuration basically similar to that of the typical example of one embodiment shown in FIGS. 5(A) to 5(D). Further, in boundary region BDR, metal layer M2 has the same configuration as that of the typical example in FIGS. 5(A) to 5(D).

However, a plurality of layers TRR, GE in boundary region BDR are arranged such that they do not overlap with vertical signal lines SGL and are arrayed to be spaced from vertical signal lines SGL relative to the direction extending along the main surface of semiconductor substrate SUB.

Also in this case, as seen from each vertical signal line SGL, the relative position of each layer TRR, GE adjacent thereto as seen in plane is all identical. That is, for any vertical signal line SGL, coordinates of a region in which each layer TRR, GE adjacent to each vertical signal line SGL exists obtained when an arbitrary identical point in each vertical signal line SGL as seen in plane is used as a reference point are substantially equal.

Therefore, the distance between each vertical signal line SGL and each layer TRR, GE adjacent thereto as seen in plane (i.e., the thickness of interlayer insulating film II) is all identical. Thus, also in the present example, the value of a parasitic capacitance formed by each vertical signal line SGL and each layer M2, TRR, GE can be uniformized as in the examples described above.

Embodiment 2

Figure 10:
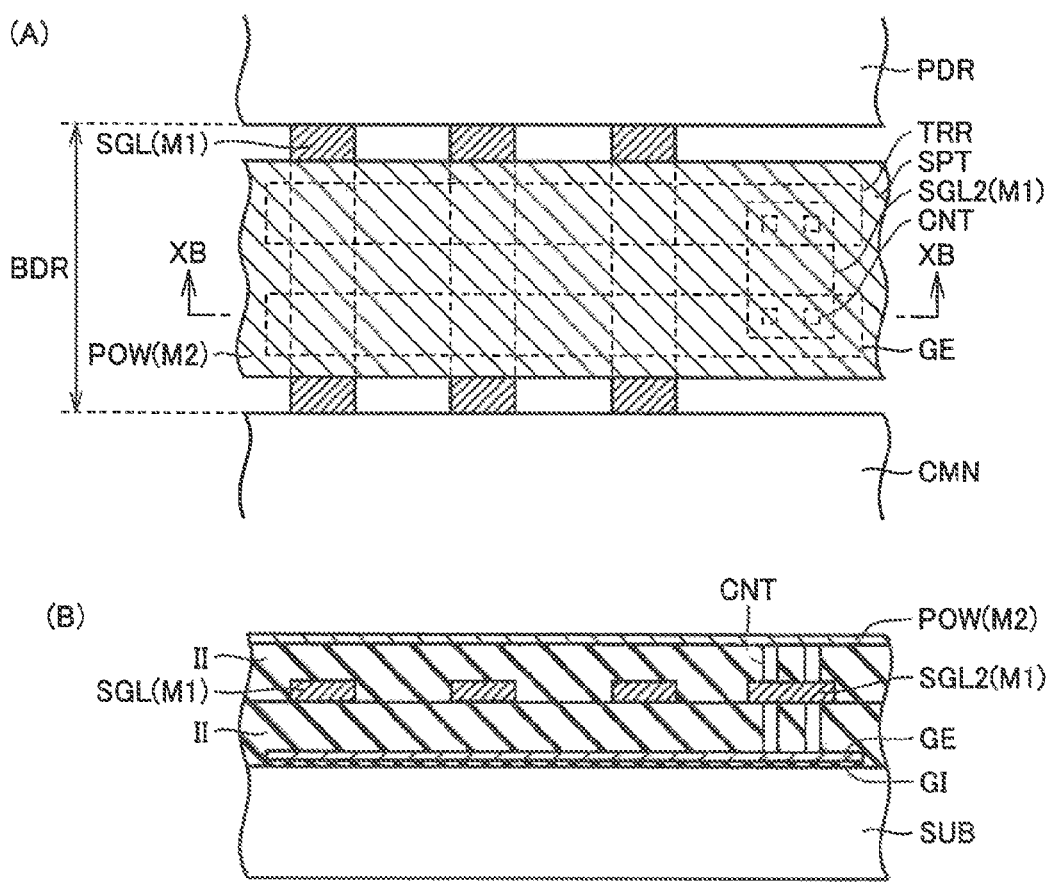
FIG. 10(A) is an enlarged plan view schematically showing a configuration of a region surrounded by the rounded dotted line in FIG. 1 as seen in plane in Embodiment 2.
FIG. 10(B) is a schematic cross sectional view in a portion along a line XB-XB in FIG. 10(A).

Referring to FIGS. 10(A) and 10(B), these have configurations basically similar to those in FIGS. 5(A) and 5(C) in Embodiment 1. In boundary region BDR, a metal layer SGL2 (M1) (formed of a commonly known metal material such as, for example, copper or aluminum) is arranged as a layer identical to vertical signal lines SGL (metal layer M1).

Referring particularly to FIG. 10(B), metal layer SGL2, metal layer M2 thereabove, and gate electrode layer GE therebelow (at least partially) overlap with one another as seen in plane. In a region in which metal layer SGL2 and layers M2, GE overlap as seen in plane, contacts CNT (penetrating conductive regions) are formed to penetrate through interlayer insulating films II.

The inside of contact CNT is filled with a conductive material such as copper or tungsten. Contacts CNT electrically connect metal layer SGL2 with both of layers M2, GE, and thereby electrically connect metal layer SGL2 with layers M2, GE. Using contacts CNT, metal layer M2 and gate electrode layer GE are conducted to each other.

This represents an example where metal layer M2 is actually used as an power source wire, and gate electrode layer GE is actually used as a gate electrode in boundary region BDR. Although not shown in FIG. 10(B), FIG. 10(A) shows that metal layer SGL2 is electrically connected with transistor formation region TRR using contacts CNT. For example, if a drain of a transistor is arranged to be electrically connected with transistor formation region TRR, metal layer SGL2 is electrically connected with the drain of the transistor. Thus, power source wire POW (M2) can be electrically connected with the drain of the transistor, and serve as a power source wire supplying a potential of the drain.

Further, for example, if a predetermined potential (fixed potential) is applied to metal layer SGL2, each layer M2, GE, TRR connected thereto can be fixed at the predetermined potential. Specifically, in FIG. 10, the fixed potential is applied to both of one conductive layer (for example, metal layer M2) as seen from vertical signal lines SGL and another conductive layer (for example, each layer TRR, GE) on a side of vertical signal lines SGL opposite to a side thereof facing the one conductive layer. However, the fixed potential may be applied to only the one conductive layer or the other conductive layer.

By applying the fixed potential to each conductive layer as in the present embodiment, vertical signal lines SGL arranged to overlap with each conductive layer above or below the conductive layer are electrically shielded by the conductive layer. Thus, for example, if the fixed potential is applied to metal layer M2, electrical noise that vertical signal lines SGL may receive from above vertical signal lines SGL can be shielded. Therefore, in present embodiment, influence of electrical noise can be uniformized among vertical signal lines SGL, in addition to the function and effect of each example of Embodiment 1. Thus, electrical characteristics such as impedance can be further uniformized among vertical signal lines SGL, and the reliability of semiconductor chip CHP can be further improved. Similarly, if the fixed potential is applied to each layer TRR, GE, electrical noise that vertical signal lines SOL may receive from below vertical signal lines SGL can be shielded, and thus the above function and effect can be further enhanced.

Embodiment 3

Referring to FIGS. 11(A) and 11(B), these have configurations basically similar to those in FIGS. 10(A) and 10(B) in Embodiment 2. Specifically, power source wire POW (conductive layer) and gate electrode layer GE (another conductive layer) are conducted to each other using contacts CNT penetrating therebetween. However, Embodiment 3 is different from Embodiment 2 in that a plurality of metal layers SGL2 are arranged to be arrayed adjacent to vertical signal lines SGL alternately.

Figure 11:
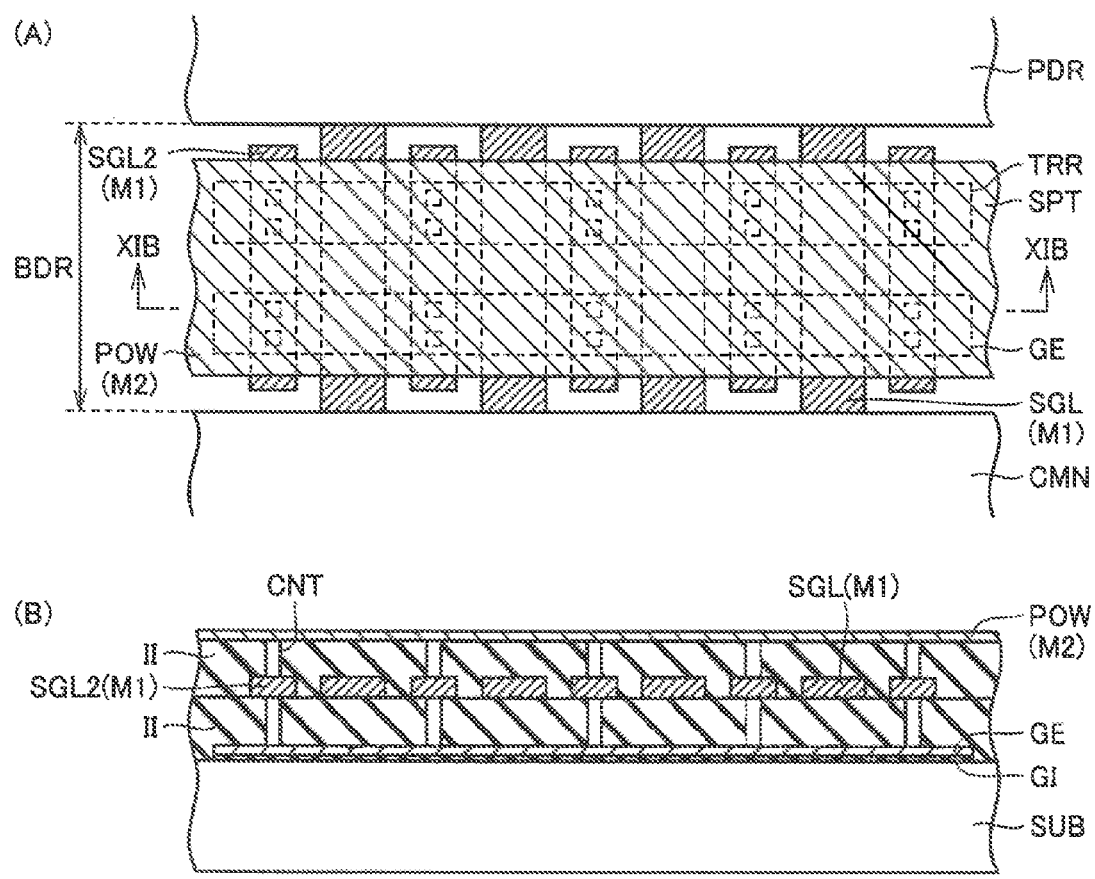
FIG. 11(A) is an enlarged plan view schematically showing a configuration of a region surrounded by the rounded dotted line in FIG. 1 as seen in plane in Embodiment 3.
FIG. 11(B) is a schematic cross sectional view in a portion along a line XIB-XIB in FIG. 11(A).

Specifically, referring to FIG. 11(B), in the present embodiment, vertical signal line SGL is surrounded by power source wire POW, gate electrode layer GE, and a pair of contacts CNT located on both sides of vertical signal line SGL (i.e., right and left sides in FIG. 11) relative to the direction intersecting with the direction in which vertical signal line SGL extends. In other words, vertical signal line SGL is surrounded by a closed circuit formed of power source wire POW, gate electrode layer GE, and the pair of contacts CNT. Further, contact CNT used herein is electrically connected to metal layer SGL2 as in Embodiment 2.

It is noted that metal layer SGL2 in FIG. 11(A) is arranged to protrude out of metal layer M2 relative to an up-down direction of the drawing, whereas metal layer SGL2 in FIG.

10(A) fits inside metal layer M2 relative to an up-down direction of the drawing. However, FIGS. 10 and 11 may have either configuration.

If a fixed potential is applied to the above closed circuit, each vertical signal line SGL is shielded by the closed circuit surrounding it, and influence of noise from the outside of the closed circuit can be reduced. Further, since each vertical signal line SGL is surrounded by the pair of contacts CNT located on both sides thereof, another vertical signal line SOL is not included inside the closed circuit surrounding that vertical signal line SGL. Thus, each vertical signal line SGL surrounded by the above closed circuit is less likely to receive electrical interference from another vertical signal line SGL arranged outside the closed circuit. Accordingly, in the present embodiment, vertical signal line SGL is shielded from external electrical noise more reliably than in Embodiment 2, and the reliability of semiconductor chip CHP can be further improved.

Each of the above embodiments describes an example where layers which replace CMP dummies arranged at desired regions by automatic control as shown in FIG. 6 are formed for the purpose of uniformizing impedances of vertical signal lines SGL arranged in boundary region BDR. However, variation in impedance to an extent less than 1 LSB of AD conversion circuit ADC (see FIG. 2(B)) arranged in column region CMN is obviously acceptable. Specifically, even if CMP dummies arranged at random as shown in FIG. 6 are formed in small quantity in the vicinity of each vertical signal line SGL, it is not necessary to eliminate the CMP dummies formed in small quantity as long as variation in impedance thereby caused falls within an extent less than 1 LSB of AD conversion circuit ADC.

Embodiment 4

While each of the above embodiments mainly describes boundary region BDR, the present embodiment will hereinafter describe a configuration of the entire semiconductor chip including light receiving element region PDR and column region CMN, with reference to FIGS. 12 to 14.

Figure 12:
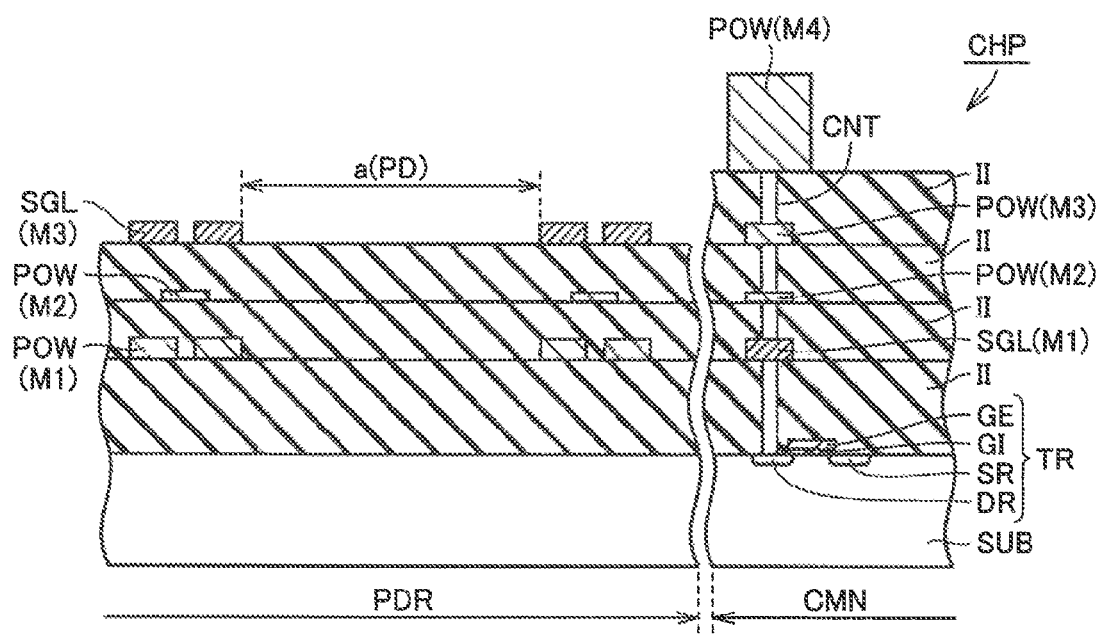
FIG. 12 is a schematic cross sectional view showing a wiring structure of a light receiving element region and a column region in a semiconductor device in Embodiment 4.

Referring to FIG. 12, semiconductor chip CHP in the present embodiment has metal layer M3 in addition to metal layers M1, M2 in light receiving element region PDR. Metal layer M3 corresponds to a metal layer not shown in each drawing in FIG. 5 as the layer above metal layer M2. Further, in column region CMN, semiconductor chip CHP has a metal layer M4 in addition to metal layers M1, M2, M3. It is noted that metal layers M1, M2 are layers identical to metal layer M1 (SGL) and metal layer M2 (POW), respectively, in boundary region BDR. Further, metal layers M3, M4 are formed of a commonly known metal material such as, for example, copper or aluminum, as with metal layers M1, M2. Metal layer M3 is formed above metal layer M2 with interlayer insulating film II interposed therebetween, and metal layer M4 is formed above metal layer M3 with interlayer insulating film II interposed therebetween. Thus, each metal layer is arranged in a layer different from the metal layer therebelow with interlayer insulating film II immediately therebelow interposed therebetween.

In the present embodiment, generally, a plurality of metal layers are laminated in light receiving element region PDR and column region CMN. The number of metal layers laminated in light receiving element region PDR is smaller than the number of metal layers laminated in column region CMN. Specifically, in FIG. 12, a total of three metal layers are arranged in light receiving element region PDR, and a total of four metal layers are arranged in column region CMN. However, the number of metal layers to be arranged in each region PDR, CMN is not limited thereto, and for example, the number of metal layers in light receiving element region PDR may be smaller than the number of metal layers in column region CMN by two or more layers.

In light receiving element region PDR, photodiodes PD as shown for example in the plan view of FIG. 2(A) are arranged. Since it is necessary to cause light to be incident on semiconductor substrate SUB in (a region planarly overlapping with) a region in which photodiodes PD are arranged, it is preferable that metal layers M1 to M3 are not arranged therein. In FIG. 12, photodiodes PD are arranged in a central portion of light receiving element region PDR, and this region has a length (in a right-left direction of the drawing) of, for example, "a".

On each of both sides (right and left sides) of photodiodes PD in light receiving element region PDR in FIG. 12, metal layer M1, metal layer M2, and metal layer M3 extend in a direction perpendicular to the paper plane (for example, an up-down direction in the plan view of FIG. 5(A)). Preferably, in light receiving element region PDR, for example, metal layers M1, M2 are power source wires POW and metal layer M3 is vertical signal line SGL. However, they are not limited thereto.

Generally, the impedance of vertical signal line SGL is increased by pulling up or down vertical signal line SGL between an upper layer and a lower layer in a laminated structure. Thus, in order to suppress an excessive increase in the impedance of vertical signal line SGL, it is preferable to arrange vertical signal line SGL in an upper layer. Accordingly, in FIG. 12, metal layer M3 as an uppermost layer is arranged as vertical signal line SGL.

While it is also preferable to arrange power source wire POW in an upper layer, if both of vertical signal line SGL and power source wire POW were arranged (parallel to each other) in metal layer M3, occupancy of wires SGL, POW in metal layer M3 as seen in plane would be increased, and it would be difficult to ensure an opening for arranging photodiodes PD therein in light receiving element region PDR. Therefore, from the viewpoint of more preferentially arranging vertical signal line SGL in an upper layer, power source wire POW is arranged below vertical signal line SGL, that is, as metal layer M1, M2.

In light receiving element region PDR, two vertical signal lines SGL (M3) are arranged to be arrayed on each of the both sides (right and left sides) of photodiodes PD, to be spaced from each other. Further, one metal layer M2 is arranged on each of the both sides, and two metal layers M1 are arranged to be arrayed on each of the both sides, to be spaced from each other.

Since two vertical signal lines SGL (as the uppermost metal layer) are arranged to be arrayed, the frame rate of motion pictures that can be processed by the solid-state imaging element in semiconductor chip CHP can be increased, when compared with a case where only one vertical signal line SGL is arranged as with metal layer M2.

On the other hand, in column region CMN, transistor TR is formed on the main surface of semiconductor substrate SUB. Transistor TR in FIG. 12 corresponds to transistor TR of AD conversion circuit ADC in FIG. 2(B). Transistor TR has, for example, a pair of source/drain regions SR, DR, gate insulating film GI, and gate electrode layer GE. Gate electrode layer GE used herein is formed as a layer identical to gate electrode layer GE that can also be used as the CMP dummy described above.

Vertical signal line SGL in column region PDR is electrically connected with, for example, drain region DR of transistor TR formed on the main surface of semiconductor substrate SUB (i.e., below metal layer M1). That is, in FIG. 12, vertical signal line SGL is directly connected with drain region DR (via contact CNT, without a conductive layer sandwiched therebetween). Namely, vertical signal line SGL used herein is also arranged to extend to transistor TR existing in AD conversion circuit ADC in column region CMN, and configured such that an electric signal is input from vertical signal line SGL to AD conversion circuit ADC (transistor TR).

In column region CMN, metal layer M1 corresponds to vertical signal line SGL. This is because vertical signal line SGL arranged as uppermost metal layer M3 in light receiving element region PDR is pulled down to lowermost metal layer M1 in column region CMN. More preferably, pulling-down of the wire is performed in boundary region BDR between light receiving element region PDR and column region CMN. Further, as vertical signal line SGL is pulled down to lowermost metal layer M1 in boundary region BDR, power source wire POW is pulled up to metal layer M2, M3 above metal layer M1 in boundary region BDR.

That is, in each of the above embodiments, vertical signal lines SGL in boundary region BDR and column region CMN are arranged as lowermost metal layer M1. Further, in boundary region BDR and column region CMN, metal layers M2 to M4 are arranged as power source wires POW (in boundary region BDR, metal layers M2 to M4 may be arranged as CMP dummies which are layers identical to power source wires POW).

Figure 13:
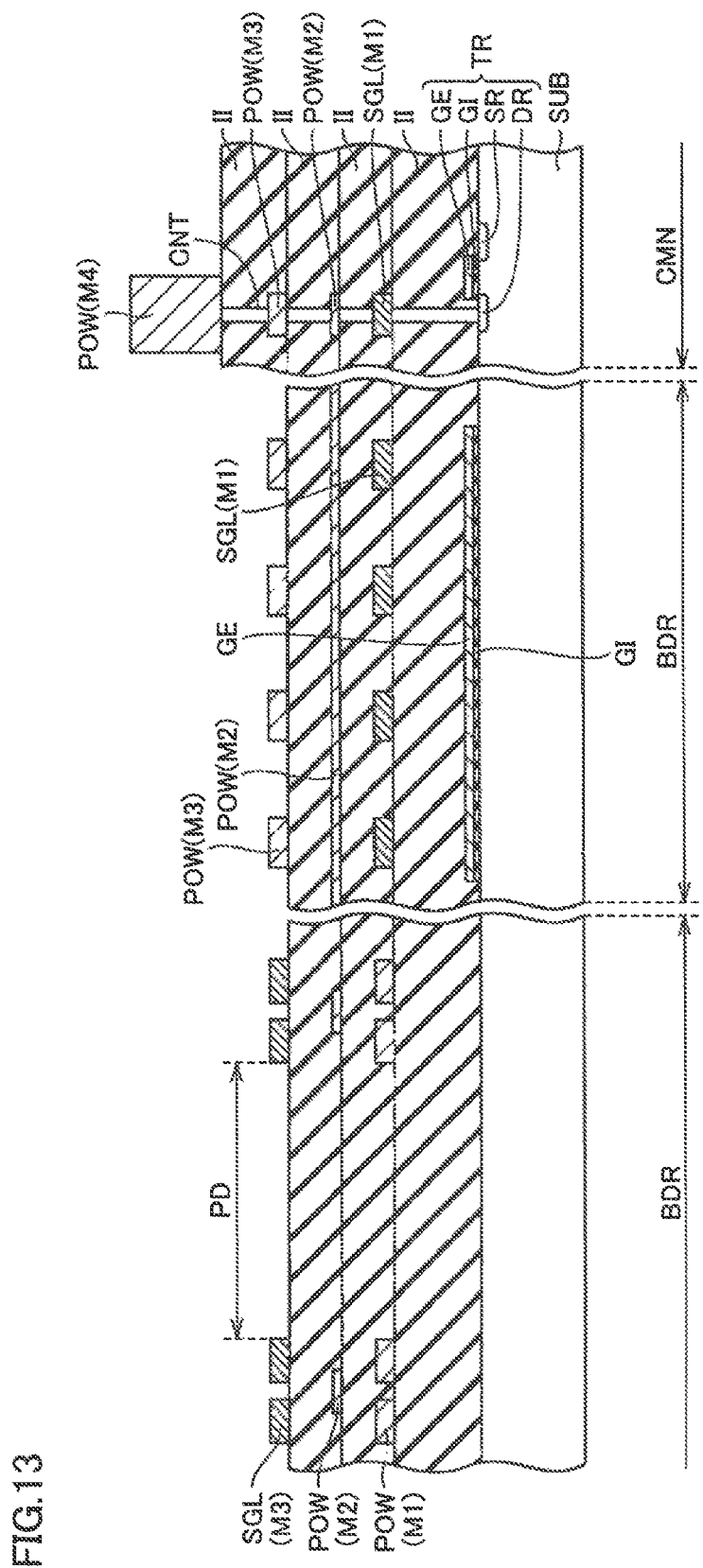
FIG. 13 is a schematic cross sectional view also showing a wiring structure of a boundary region added to FIG. 12.

This configuration is shown in FIG. 13. Referring to FIG. 13, light receiving element region PDR and column region CMN have configurations identical to those of light receiving element region PDR and column region CMN in FIG. 12, and boundary region BDR in FIG. 13 has a configuration identical to, for example, the cross sectional view of FIG. 5(B). It is noted that boundary region BDR in FIG. 13 merely shows the relation between metal layers M1 to M3 and power source wires POW and vertical signal lines SGL arranged therein. Accordingly, although a right-left direction of boundary region BDR in FIG. 13 corresponds to the right-left direction in, for example, FIG. 5(A), it does not always match a right-left direction of light receiving element region PDR and column region CMN in FIG. 13.

In column region CMN, transistor TR, signal line SGL (M1), and power source wires POW (M2 to M4) are electrically connected using contacts CNT.

Vertical signal line SGL as uppermost metal layer M3 in light receiving element region PDR is thinner than power source wire POW as uppermost metal layer M4 in column region CMN. Next, the function and effect of the present embodiment will be described with reference to a comparative example in FIG. 14. The present embodiment has the following function and effect, in addition to the function and effect of Embodiment 1.

Figure 14:
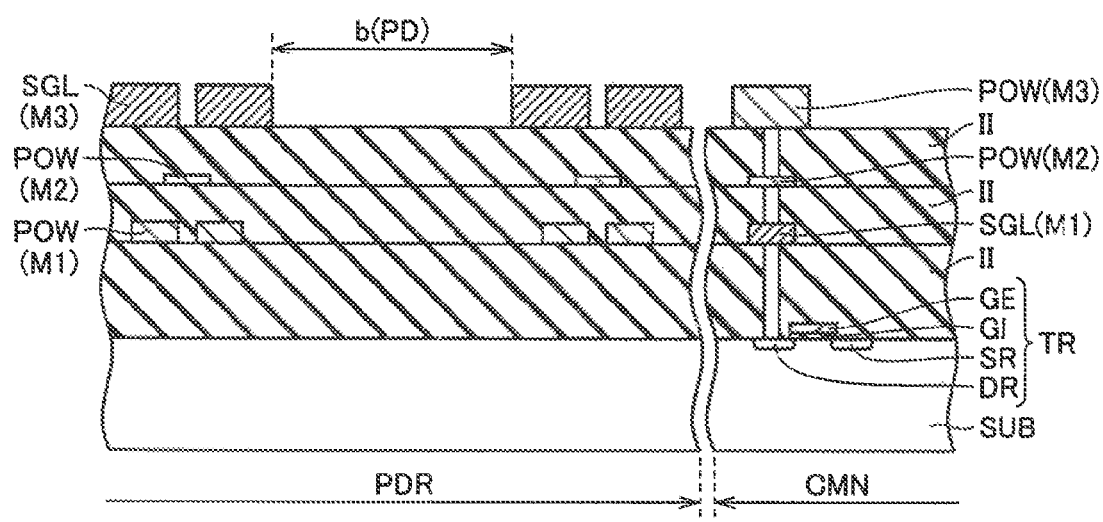
FIG. 14 is a schematic cross sectional view showing a wiring structure of a light receiving element region and a column region in a semiconductor device in a comparative example of Embodiment 4.

Referring to FIG. 14, the configuration of semiconductor chip CHP in the comparative example is basically similar to that of semiconductor chip CHP in FIG. 12. However, the same number of metal layers (M1 to M3: three layers) are arranged in both light receiving element region PDR and column region CMN. Further, metal layer M3 is thicker than metal layers M1, M2.

Metal layer M3 is an uppermost metal layer, and particularly preferably has a low resistance as power source wire POW in column region CMN. Thus, metal layer M3 in column region CMN is formed thicker than metal layers M1, M2. Further, since metal layer M3 as power source wire POW in column region CMN and metal layer M3 in light receiving element region PDR are formed as an identical layer, the both has an equal thickness, and metal layer M3 in light receiving element region PDR is also formed thicker than metal layers M1, M2.

However, if uppermost metal layer M3 in light receiving element region PDR is thick, it is difficult to ensure an opening for arranging photodiodes PD therein. That is, a length "b" of a region in which photodiodes PD are arranged in FIG. 14 (in a right-left direction of the drawing) is shorter than length "a" in FIG. 12. If the opening for photodiodes PD becomes narrow, there is a possibility that the light-collecting rate in photodiodes PD is reduced and an output of photodiodes PD is weakened.

Therefore, as shown in FIG. 12, in light receiving element region PDR, the total number of metal layers is smaller than that in column region CMN, and uppermost metal layer M3 is thinner than metal layer M3 in FIG. 14. Further, in column region CMN, uppermost metal layer M4 (which is not formed in light receiving element region PDR) is formed.

With such a configuration, an opening for the region in which photodiodes PD are arranged in light receiving element region PDR can be ensured, and the electrical resistance of uppermost metal layer M4 in column region CMN can be reduced by thickening metal layer M4. Therefore, in the present embodiment, the function and effect can also be exhibited for light receiving element region PDR and column region CMN, in addition to the function and effect regarding vertical signal lines SOL in boundary region BDR in each of the embodiments described above, and thus semiconductor chip CHP as a solid-state imaging element having further improved electrical characteristics can be provided.

Although the embodiments of the present invention have been described above, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:
1. A semiconductor device comprising:
a semiconductor substrate having a main surface;
a light receiving element region formed in said main surface of said semiconductor substrate, in which light receiving elements for performing photoelectric conversion are formed;
a peripheral region formed outside said light receiving element region in said main surface of said semiconductor substrate for performing input/output of electric signals from/to said semiconductor substrate;
a boundary region formed between said light receiving element region and said peripheral region in plan view;
a plurality of signal lines arranged in said boundary region for performing input/output of electric signals between said light receiving element region and said peripheral region; and
a CMP dummy arranged in a layer different from each of the plurality of said signal lines,
wherein a relative position of said CMP dummy with respect to each of the plurality of said signal lines is the same,
wherein said CMP dummy is arranged in a single layer,
wherein a fixed potential is applied to said CMP dummy, and
wherein said CMP dummy overlaps with each of the plurality of said signal lines in plan view.

2. The semiconductor device according to claim 1, wherein said CMP dummy comprises a single unitary member that overlaps with all of the plurality of said signal lines.

3. The semiconductor device according to claim 1, wherein an area of overlap between the CMP dummy and the signal line in plan view is the same for each signal line, and a relative location of said overlap along the signal line is the same for each signal line.

4. A semiconductor device comprising:
a semiconductor substrate;
a light receiving element region with a plurality of light receiving elements formed in the semiconductor substrate, the light receiving elements being configured for photoelectric conversion;
a peripheral region configured for communicating electrical signals to/from the semiconductor device;
a boundary region disposed between the light receiving element region and the peripheral region in plan view;
a plurality of signal lines configured for communicating electrical signals between the light receiving element region and the peripheral region, each of the signal lines extending from the light receiving element region through the boundary region to the peripheral region; and
a CMP dummy disposed in the boundary region in a layer different from the plurality of signal lines,
wherein the CMP dummy is arranged in single layer and has a fixed potential applied thereto,
wherein an arrangement of the CMP dummy with respect to each of the signal lines is such that an impedance of each of the signal lines is the same, and
wherein the CMP dummy overlaps each of the plurality of signal lines in plan view.

5. The semiconductor device according to claim 4, wherein an area of overlap between the CMP dummy and the signal line in plan view is the same for each signal line, and a relative location of said overlap along the signal line is the same for each signal line.

* * * * *